United States Patent
Kim

(10) Patent No.: US 9,412,430 B2
(45) Date of Patent: Aug. 9, 2016

(54) ELECTRONIC DEVICE AND METHOD FOR FABRICATING THE SAME

(71) Applicant: SK HYNIX INC., Icheon (KR)

(72) Inventor: Hyo-Jin Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 127 days.

(21) Appl. No.: 14/321,719

(22) Filed: Jul. 1, 2014

(65) Prior Publication Data

US 2015/0206585 A1 Jul. 23, 2015

(30) Foreign Application Priority Data

Jan. 17, 2014 (KR) .................. 10-2014-0006105

(51) Int. Cl.
| | |
|---|---|
| *H01L 45/00* | (2006.01) |
| *G11C 14/00* | (2006.01) |
| *G11C 11/22* | (2006.01) |
| *H01L 27/24* | (2006.01) |
| *G11C 13/00* | (2006.01) |
| *H01L 27/22* | (2006.01) |
| *G11C 11/16* | (2006.01) |

(52) U.S. Cl.
CPC ............ *G11C 11/22* (2013.01); *H01L 27/2409* (2013.01); *H01L 27/2418* (2013.01); *H01L 27/2463* (2013.01); *H01L 27/2472* (2013.01); *H01L 45/04* (2013.01); *H01L 45/06* (2013.01); *H01L 45/122* (2013.01); *H01L 45/141* (2013.01); *H01L 45/146* (2013.01); *H01L 45/147* (2013.01); *H01L 45/1683* (2013.01); *G11C 11/16* (2013.01); *G11C 13/0004* (2013.01); *G11C 13/0007* (2013.01); *G11C 2213/73* (2013.01); *G11C 2213/76* (2013.01); *H01L 27/224* (2013.01)

(58) Field of Classification Search
CPC .... G11C 11/16; G11C 11/22; G11C 13/0004; G11C 13/0007; G11C 2213/73; G11C 2213/76; H01L 27/222; H01L 27/224; H01L 27/2409; H01L 27/2463; H01L 27/2472; H01L 45/04; H01L 45/06; H01L 45/122; H01L 45/1253; H01L 45/141; H01L 45/146; H01L 45/147; H01L 45/1683
USPC ................................................ 257/4; 711/103
See application file for complete search history.

(56) References Cited

U.S. PATENT DOCUMENTS

| | | | | |
|---|---|---|---|---|
| 2008/0210932 | A1* | 9/2008 | Yukawa ................. | B82Y 10/00 257/40 |
| 2009/0289251 | A1* | 11/2009 | Kiyotoshi ........... | H01L 27/1021 257/43 |
| 2010/0252831 | A1* | 10/2010 | Park .................... | H01L 27/2463 257/49 |
| 2013/0168634 | A1* | 7/2013 | Lee ..................... | H01L 45/1253 257/4 |
| 2014/0131653 | A1* | 5/2014 | Lee ....................... | G11C 11/00 257/4 |

* cited by examiner

*Primary Examiner* — David Vu
*Assistant Examiner* — Jonathan Han

(57) ABSTRACT

An electronic device including a semiconductor memory is provided. The semiconductor memory includes a first electrode, a second electrode crossing the first electrode, and a variable resistance pattern positioned in an intersection region of the first electrode and the second electrode and buried in the first electrode.

11 Claims, 13 Drawing Sheets

ELECTRONIC DEVICE AND METHOD FOR FABRICATING THE SAME

CROSS-REFERENCE TO RELATED APPLICATIONS

The present application claims priority of Korean Patent Application No. 10-2014-0006105, entitled "ELECTRONIC DEVICE AND METHOD FOR FABRICATING THE SAME", and filed on Jan. 17, 2014, which is incorporated herein by reference in its entirety.

TECHNICAL FIELD

This patent document relate to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which a change in characteristics of a variable resistance layer can be prevented, and a fabricating method thereof.

In one aspect, an electronic device including a semiconductor memory is provided, wherein the semiconductor memory includes: a first electrode; a second electrode crossing the first electrode; and a variable resistance layer positioned at an intersection of the first electrode and the second electrode, and buried in the first electrode.

Implementations of the above method may include one or more of the following.

The semiconductor memory may further include a barrier layer formed between the first electrode and the variable resistance layer. The barrier layer may include a selection element material. A line width of the second electrode may be identical to or smaller than a line width of the variable resistance layer. The variable resistance layer may include any one single layer selected from the group consisting of transitional metal oxide, perovskite-based oxide and a chalcogenide-based compound, or a stack layer thereof. The first electrode and the second electrode may be vertically opposite to each other, or horizontally opposite to each other.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device including a semiconductor memory includes: forming a first electrode; forming a trench in the first electrode; forming a variable resistance pattern buried in the trench; and forming a second electrode contacting with the variable resistance pattern.

Implementations of the above method may include one or more of the following.

The method may further include forming a barrier layer along a surface of the trench before forming the variable resistance pattern. The forming a variable resistance pattern buried in the trench may include: forming a variable resistance layer to fill the trench; and performing a planarization process is performed on the variable resistance layer until the first electrode is exposed. The planarization process may include a chemical mechanical planarization (CMP) process. A line width of the second electrode may be identical to or smaller than a line width of the variable resistance pattern.

These and other aspects, implementations and associated advantages are described in greater detail in the drawings, the description and the claims.

DETAILED DESCRIPTION

Figure 1:
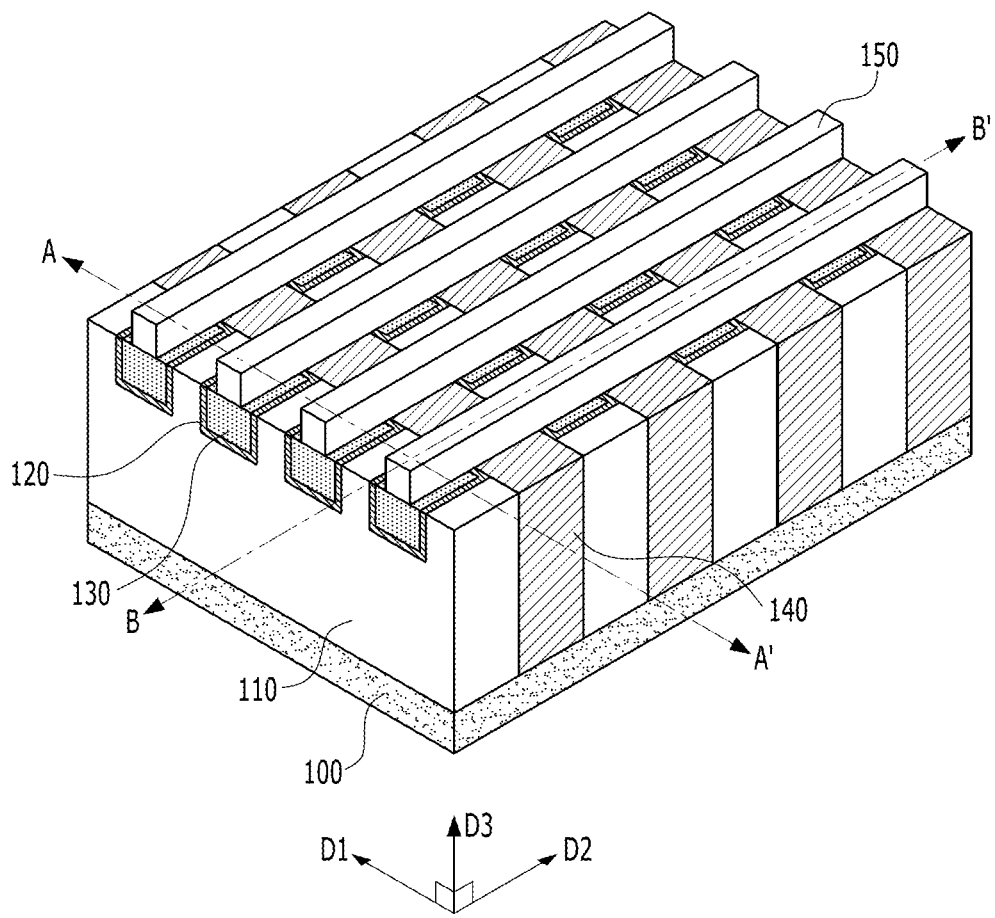
FIG. 1 illustrates a perspective view of a semiconductor memory device in accordance with an embodiment of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2A:
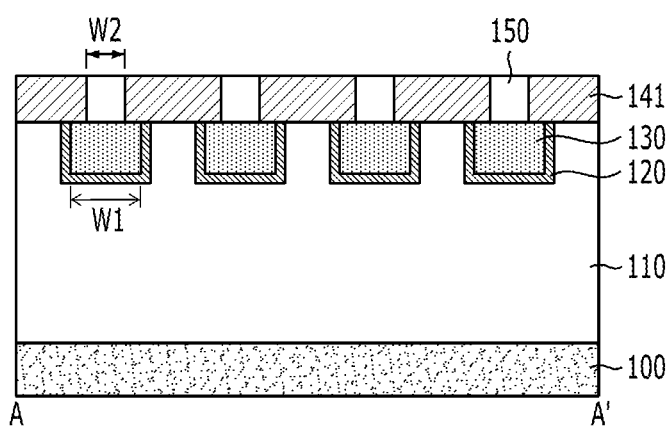
FIGS. 2A and 2B illustrate cross-sectional views of the semiconductor memory device shown in FIG. 1.
Figure 2B:
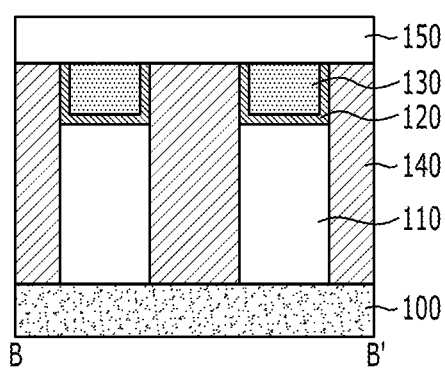

FIG. 1 is a perspective view of a semiconductor memory device in accordance with an embodiment of the present disclosure. FIGS. 2A and 2B are cross-sectional views taken along lines A-A' and B-B' of FIG. 1, respectively.

Referring to FIG. 1 and FIGS. 2A and 2B, a semiconductor memory device includes a first electrode 110 disposed over a substrate 100, a second electrode 150 crossing the first electrode 110, and a variable resistance pattern 130, which is positioned in an intersection region where the first electrode 110 intersects with the second electrode 150. The variable resistance pattern 130 is buried in the first electrode 110.

The substrate 100 may include a silicon substrate used in a typical semiconductor device, or an insulating substrate such as glass, plastic, or the like.

The first electrode 110 has a line shape and extends in a first direction D1. Adjacent first electrodes 110 are spaced apart from each other by a distance in a second direction D2. The first electrode 110 may include a conductive layer, e.g., a metallic layer. A first insulation layer 140 is disposed in the space between adjacent first electrodes 110, which are spaced apart from each other by a distance. The first insulation layer 140 may include a single layer or a multi-layer. The first insulation layer 140 may include one or more selected from the group consisting of an oxide layer, a nitride layer, and an oxynitride layer.

The second electrode 150 has a line shape and extends in the second direction D2, which crosses the first direction D1 of the first electrodes 110. Adjacent second electrodes 150 are disposed parallel to each other and are spaced apart from each other by a distance in the first direction D1. The second electrode 150 may include a conductive layer, e.g., a metallic layer. A second insulation layer 141 is disposed in the space between adjacent second electrodes 150, which are spaced apart from each other by a distance, as shown in FIG. 2A. The second insulation layer 141 may include a single layer or a multi-layer. The second insulation layer 141 includes one or more selected from the group consisting of an oxide layer, a nitride layer, and an oxynitride layer.

A line width W2 of the second electrode 150 in the first direction D1 is identical to or smaller than a width W1 of the variable resistance pattern 130 in a same direction, e.g., the first direction D1. If the width W1 of the variable resistance pattern 130 is greater than the line width W2 of the second electrode, then the first electrode 110 may not be in contact with the second electrode 150. Accordingly, a short between the first electrode 110 and the second electrode 150 may be prevented.

The variable resistance pattern 130 is disposed in an intersection region of the first electrode 110 and the second electrode 150. The variable resistance pattern 130 fills a trench formed in the first electrode 110. The variable resistance pattern 130 is buried in the trench formed in the first electrode 110 such that the uppermost surface of the variable resistance pattern 130 is level or coplanar with the uppermost surface of the first electrode 110, or disposed at a lower level than the uppermost surface of the first electrode 110. The variable resistance pattern 130 has a width W1 in the first direction D1 that is greater than a line width W2 of the second electrode 150 in the first direction D1. Accordingly, a part of a top surface of the variable resistance pattern 130 may be exposed, while sides and the bottom of the variable resistance pattern 130 may be covered by the first electrode 110.

The trench may have an island configuration that forms a shape in the uppermost surface of the first electrode 110. For example, the trench may have any of various shapes such as a cone shape, a cylindrical shape, a pyramidal shape, an asymmetrical polygon shape, and the like. In another embodiment, the trench may have a line shape extending in the second direction D2. An embodiment in which the trench has a line shape will be described later with reference to FIGS. 8, 9A, and 9B.

The variable resistance pattern 130 may include a variable resistance material, which is used in a resistance change memory device to store and erase information using a change in a resistive characteristic of the variable resistance material. The variable resistance pattern 130 may include any of various materials used in an RRAM (resistive random access memory) device, a PRAM (phase change random access memory) device, an FRAM (ferroelectric random access memory) device, an MRAM (magnetic random access memory) device, and the like. Accordingly, the variable resistance material may include a metal oxide such as a transitional metal oxide, a perovskite-based material, a phase-change material such as a chalcogenide-based compound, a ferroelectric material, a ferromagnetic material, and so on. The variable resistance pattern 130 may include a single layer or a multi-layer of the above materials.

A barrier layer 120 may be disposed between the variable resistance pattern 130 and the first electrode 110. In an embodiment in which the variable resistance pattern 130 has an island configuration, the trench formed in the first electrode 110 also exposes portions of sidewalls of the first insulation layer 140. Thus, in an embodiment, as shown in FIG. 2B, if the trench in which the variable resistance pattern 130 is formed exposes sidewalls of first insulation layers 140, which are disposed between adjacent first electrodes 110, the barrier layer 120 is disposed between the variable resistance pattern 130 and the first electrode 110 and between the variable resistance pattern 130 and the first insulation layers 140.

The barrier layer 120 may include a selection element material which prevents deterioration of device characteristics by preventing a diffusion of a material in the variable resistance pattern 130 and protecting the variable resistance pattern 130. Thus, the barrier layer 120 may serve as a selection element. The selection element may control a current supply to the variable resistance pattern 130 according to a voltage applied to the first electrode 110 or the second electrode 150. In particular, the barrier layer 120 may not supply a current to the variable resistance pattern 130 if the voltage is lower than a threshold voltage. On the other hand, if the voltage is greater than or equal to the threshold voltage, the barrier layer 120 may supply a current to the variable resistance pattern 130 to switch the resistance state of the variable resistance pattern 130.

The barrier layer 120 may include a metallic layer or a material serving as a diode, a tunnel barrier, a metal-insulator transition (MIT) element, or the like. For example, the barrier layer 120 may include one or more layers of titanium nitride (TiN), niobium oxide ($NbO_2$), and the like.

In an embodiment, the first electrode 110 orthogonally crosses the second electrode 150.

In other words, when the first electrode 110 and the second electrode 150 extend in the first direction D1 and the second direction D2, respectively, the first and second directions D1 and D2 are orthogonal to each other. However, embodiments are not limited thereto.

The first electrodes 110 may extend in a vertical direction, i.e., a third direction D3, and are spaced apart from each other by a distance in the second direction D2. At this time, the first electrode 110 and the second electrode 150 may be vertically opposite to each other. Accordingly, in accordance with embodiments of the present disclosure, the first electrode 110 and the second electrode 150 may be vertically opposite to each other, or horizontally opposite to each other.

Figure 3:
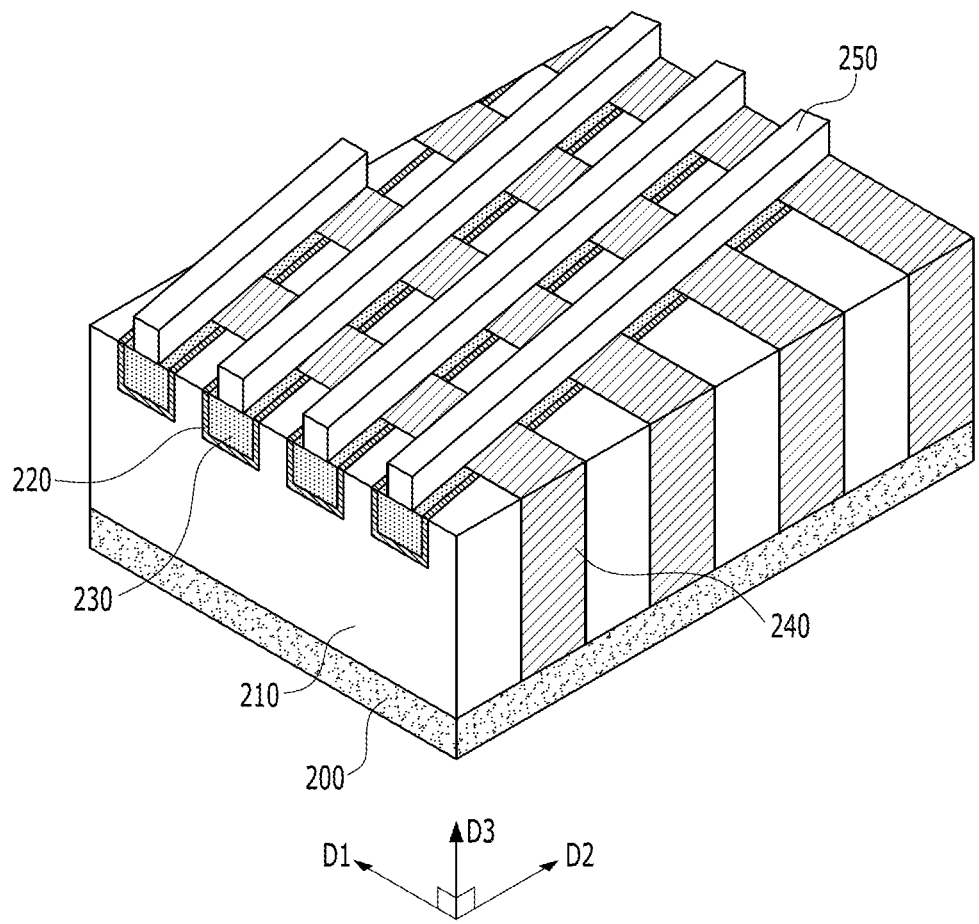
FIG. 3 illustrates a perspective view of a semiconductor memory device in accordance with another embodiment of the present disclosure.

FIG. 3 illustrates a perspective view of a semiconductor memory device in accordance with another embodiment of the present disclosure. FIG. 3 shows that a first electrode 210 is oblique with respect to a second electrode 250.

In FIG. 3, variable resistance patterns 230 are disposed in respective first electrodes 210. The variable resistance patterns 230 are arranged to align with the second electrodes 250. For example, the variable resistance pattern 230 disposed in a first electrode 210 and the variable resistance pattern 230 disposed in an adjacent first electrode 210 are disposed along an oblique line that is parallel to the second electrode 250. A barrier layer 220 is disposed between the variable resistance pattern 230 and the first electrode 210. An insulation layer 240 is disposed between adjacent first electrodes 230.

In an embodiment, if a trench in which the variable resistance pattern 230 is formed exposes sidewalls of first insulation layers 240 disposed between adjacent first electrodes 210, the barrier layer 220 is disposed between the variable resistance pattern 230 and the first electrode 110 and between the variable resistance pattern 230 and first insulation layers 140.

The configuration of the semiconductor memory device shown in FIG. 3 is substantially the same as that of the semiconductor memory device shown in FIG. 1 except that the first electrode 210 and the second electrode 250 are disposed non-orthogonally to each other. Accordingly, detailed descriptions thereof are omitted.

Figure 4A:
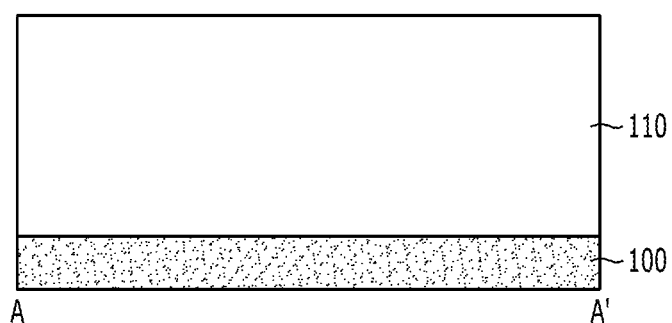
FIGS. 4(A) and (B) to 7(A) and (B) are cross-sectional views illustrating a method for fabricating the semiconductor memory device of FIG. 1 in accordance with an embodiment of the present disclosure.

FIGS. 4(A) and (B) to 7(A) and (B) are cross-sectional views illustrating a method for fabricating the semiconductor memory device shown in FIG. 1 in accordance with an embodiment of the present disclosure. In FIGS. 4 to 7, FIGS. 4A, 5A, 6A, and 7A correspond to cross-sectional views taken along the line A-A' of FIG. 1, and FIGS. 4B, 5B, 6B, and 7B correspond to cross-sectional views taken along the line B-B' of FIG. 1.

Figure 4B:
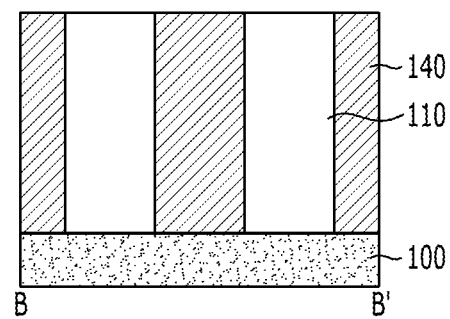

Referring to FIGS. 4A and 4B, a plurality of first electrodes 110 separated by a first insulation layer 140 are formed over a substrate 100. The first electrodes 110 may be formed in an elongated shape, such as a line shape or a bar shape, and extend in a first direction D1. Adjacent first electrodes 110 are formed to be spaced apart from each other by a distance in a second direction D2 crossing the first direction D1.

In an embodiment, the first electrodes 110 and the first insulation layer 140 are formed by forming trenches defining the plurality of first electrodes 110 over the substrate 100 and filling the trenches between the first electrodes 110 with a first insulation material to form the first insulation layer 140. In another embodiment, the first electrodes 110 and the first insulation layer 140 are formed by forming a plurality of trenches in the first insulation layer 140 formed over the substrate 100 and filling the trenches with a conductive material to form the first electrodes 110.

The first electrodes 110 may be formed of a conductive layer, e.g., a metallic layer. The first insulation layer 140 may include a single layer or a multi-layer. The first insulation layer 140 may include one or more selected from the group consisting of an oxide layer, a nitride layer, and an oxynitride layer.

Figure 5A:
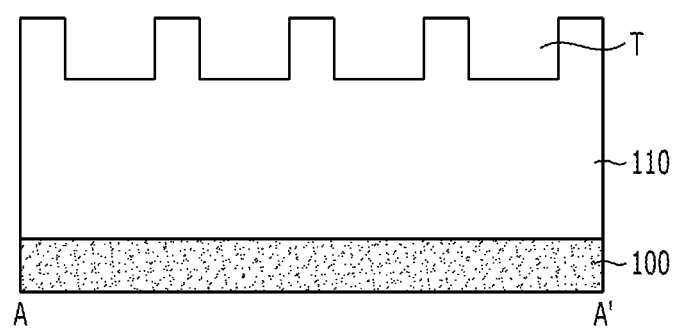
Figure 5B:
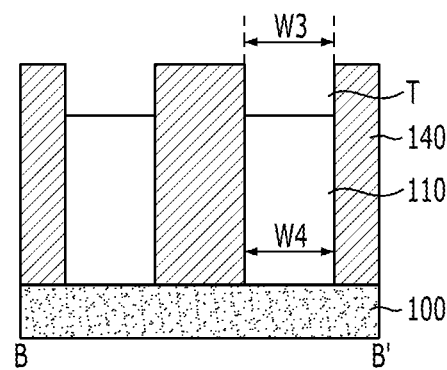

Referring to FIGS. 5A and 5B, a plurality of trenches T is formed in the first electrodes 110 by selectively etching the first electrodes 110. The trenches T provide spaces for variable resistance patterns to be formed. Plural trenches T are formed in one first electrode 110 and are spaced apart from each other by a distance as shown in FIG. 5A.

The trench T may have an island configuration that forms a shape in the uppermost surface of the first electrode 110. For example, the trench T may have any of various shapes such as a cone shape, a cylindrical shape, a pyramidal shape, an asymmetrical polygon shape, and the like. In another embodiment, the trench T may have a line shape and extend in the second direction D2, which will be described later with reference to FIG. 8.

Figure 6A:
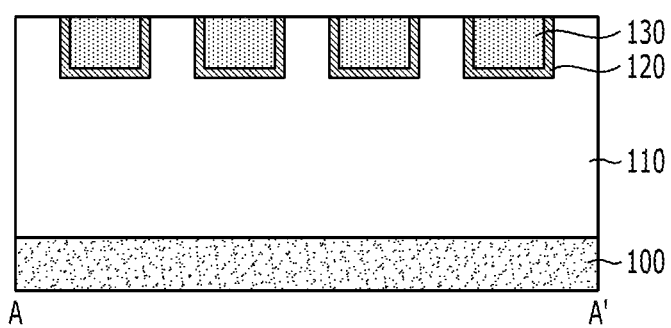
Figure 6B:
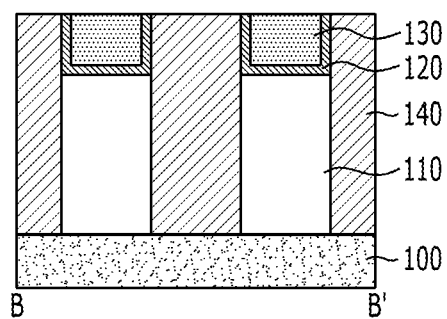

Referring to FIGS. 6A and 6B, a barrier layer 120 is formed along a profile of a resultant structure including the trenches T. Subsequently, a variable resistance layer is formed over the barrier layer 120 to gap-fill the trenches T.

The barrier layer 120 may include a selection element material which prevents deterioration of device characteristics by preventing a diffusion of a material contained in the variable resistance pattern 130 and protecting the variable resistance pattern 130. Thus, the barrier layer 120 may serve as a selection element. The selection element may control a current supply to the variable resistance pattern 130 according to a voltage applied to the first electrode 110 or a second electrode 150, which is formed in a subsequent process. In particular, the barrier layer 120 may not supply a current to the variable resistance pattern 130 if the voltage is lower than a threshold voltage. On the other hand, if the voltage is greater than or equal to the threshold voltage, the barrier layer 120 may supply a current to the variable resistance pattern 130 to switch the resistance state of the variable resistance pattern 130.

The barrier layer 120 may include a metallic layer or a material serving as a diode, a tunnel barrier, a metal-insulator transition (MIT) element, or the like. For example, the barrier layer 120 may include one or more layers of titanium nitride (TiN), niobium oxide ($NbO_2$), and the like.

The variable resistance layer may include any of various materials used in an RRAM device, a PRAM device, an FRAM device, an MRAM device, and the like. Accordingly, the variable resistance layer may include a metal oxide such as a transitional metal oxide, a perovskite-based material, a phase-change material such as a chalcogenide-based compound, a ferroelectric material, a ferromagnetic material, and so on. The variable resistance layer may include one or more layers of the above materials.

Subsequently, a planarization process is performed on a resultant structure including the variable resistance layer until a top surface of the first electrode 110 is exposed. As a result, the variable resistance patterns 130 disposed in the trenches T are formed.

The planarization process may include a chemical mechanical planarization (CMP) process. The variable resistance patterns 130 are formed by the planarization process and thus fill the trenches T. That is, the variable resistance patterns 130 are buried in the trenches T.

By the planarization process, a top surface of the barrier layer 120 may be level with top surfaces of the first electrode 110 and the variable resistance pattern 130.

Figure 7A:
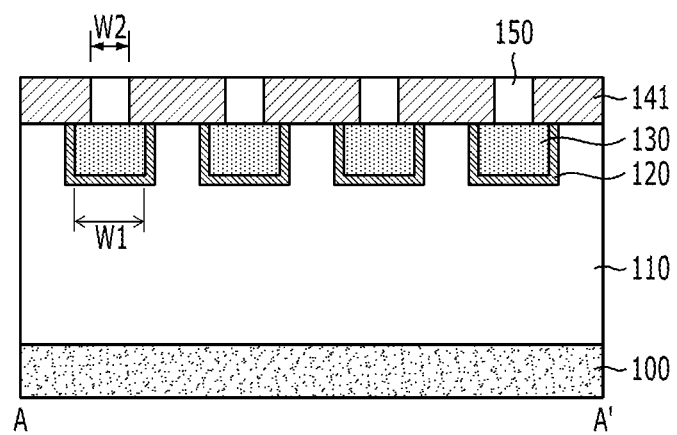
Figure 7B:
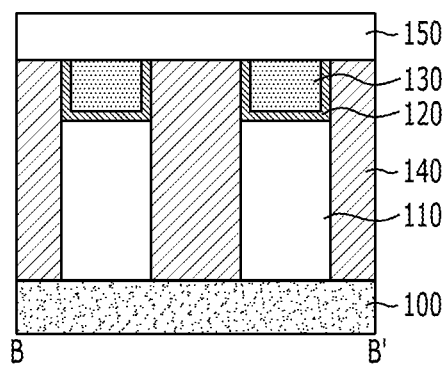

Referring to FIGS. 7A and 7B, after a conductive layer (not shown) is formed over a resultant structure including the variable resistance patterns 130, a plurality of second electrodes 150 contacting the variable resistance patterns 130 are formed by selectively etching the conductive layer. The second electrodes 150 may be formed in an elongated shape, such as a line shape or a bar shape, and extend in the second direction D2 crossing the first direction D1. Adjacent second electrodes 150 may be spaced apart from each other by a distance in the first direction D1.

In the first direction D1, a line width W2 of the second electrode 150 is identical to or smaller than a width W1 of the variable resistance pattern 130. Accordingly, a short between the first electrode 110 and the second electrode 150 may be prevented. The second electrodes 150 may be formed of a conductive material, e.g., a metallic material.

Subsequently, a second insulation layer 141 is formed to fill spaces between the second electrodes 150. The second insulation layer 141 may include a single layer or a multilayer. The second insulation layer 141 may be one or more selected from the group consisting of an oxide layer, a nitride layer, and an oxynitride layer.

According to a method for fabricating a semiconductor memory device in accordance with embodiments of the present disclosure, since variable resistance patterns are disposed in trenches that are formed in the first electrodes, an etch process for patterning a variable resistance layer is not required. Accordingly, damage to the variable resistance layer due to such an etch process may be prevented, and thus a change in characteristics of the variable resistance patterns may be prevented.

Figure 8:
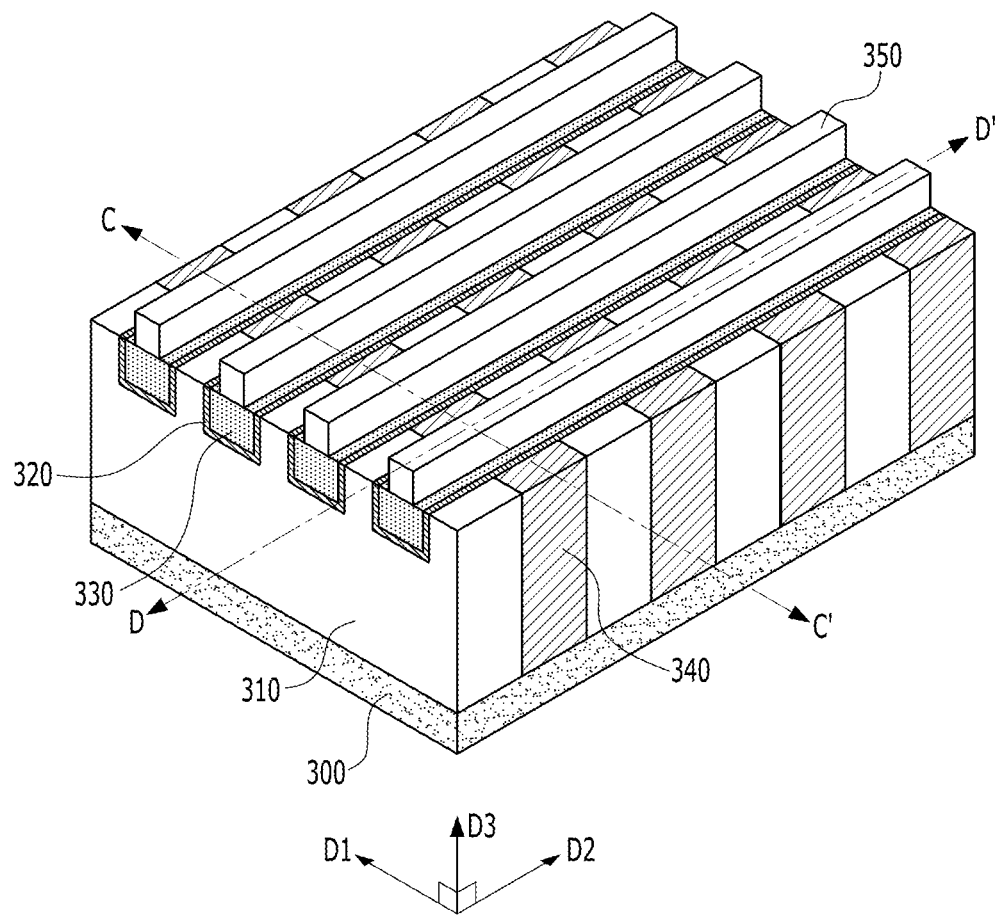
FIG. 8 illustrates a perspective view of a semiconductor memory device in accordance with still another embodiment of the present disclosure.
Figure 9A:
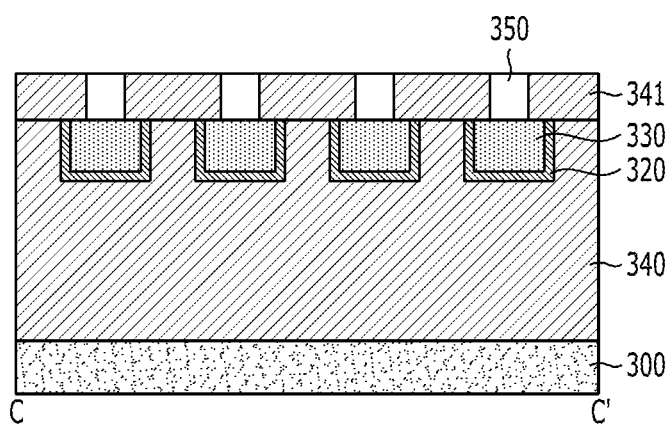
FIGS. 9A and 9B illustrate cross-sectional views of the semiconductor memory device shown in FIG. 8.
Figure 9B:
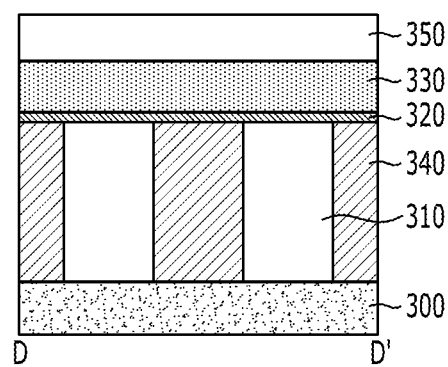

FIG. 8 is a perspective view of a semiconductor memory device in accordance with still another embodiment of the present disclosure. FIGS. 9A and 9B are cross-sectional views taken along lines C-C' and D-D' of FIG. 8, respectively.

Referring to FIG. 8, a semiconductor memory device includes a first electrode 310 disposed over a substrate 300, a second electrode 350 crossing the first electrode 310, and a variable resistance layer 330 disposed under the second electrode 350. The first electrode 310 and the second electrode 350 may be formed in substantially the same manner as the first electrode 110 and the second electrode 150 shown in FIG. 1, respectively.

The variable resistance layer 330 has a line shape and extends in a second direction D2 under the second electrode 350. The variable resistance layer 330 extends through and is buried in alternating first electrodes 310 and first insulation layers 340, which are disposed between adjacent first electrodes 310.

A barrier layer 320 may be disposed between the variable resistance layer 330 and each of the first electrodes 310 and first insulation layers 340. The barrier layer 320 extends in the second direction D2.

In the embodiment of FIG. 8, a variable resistance pattern is positioned at an intersection of the first electrode 310 and the second electrode 350.

In accordance with embodiments of the present disclosure, by burying the variable resistance pattern in the first electrode, an etch process for patterning a variable resistance layer to form the variable resistance pattern is not required. Accordingly, a change in characteristics of the variable resistance pattern due to the etch process may be prevented, and thus the reliability of the variable resistance pattern may be secured.

Furthermore, by forming the variable resistance pattern to have a structure that is buried in the first electrode, an area in which the variable resistance pattern directly or indirectly contacts the first electrode may increase, and thus the influence of the first electrode on the variable resistance pattern may be enhanced.

Figure 10:
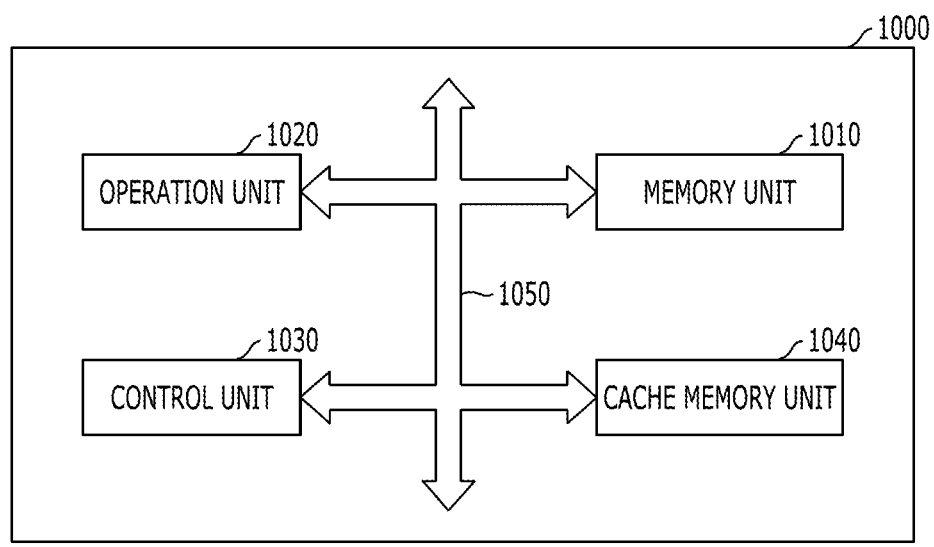
FIG. 10 is an example of configuration diagram of a microprocessor implementing memory circuitry based on the disclosed technology.

The above and other memory circuits or semiconductor devices based on the disclosed technology can be used in a range of devices or systems. FIGS. 10-14 provide some examples of devices or systems that can implement the memory circuits disclosed herein FIG. 10 is an example of configuration diagram of a microprocessor implementing memory circuitry based on the disclosed technology.

Referring to FIG. 10, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first electrode; a second electrode crossing the first electrode; and a variable resistance layer positioned at an intersection of the first electrode and the second electrode, and buried in the first electrode. An additional etch process for patterning the variable resistance layers is not required. Accordingly, a damage of the variable resistance layers due to the etch process may be prevented, and thus a change in characteristics of the variable resistance layers may be prevented. Through this, characteristics of a transistor of the memory unit 1010 may be improved, and the degree of process difficulty in fabricating the memory unit 1010 may be reduced by substantially preventing the occurrence of a step difference between regions difference from each other, thereby improving the data storage characteristics of the memory unit 1010 in case that the transistor is coupled to a memory element, for example, a resistance variable element. As a consequence, a fabrication process of the microprocessor 1000 may become easy and performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 11:
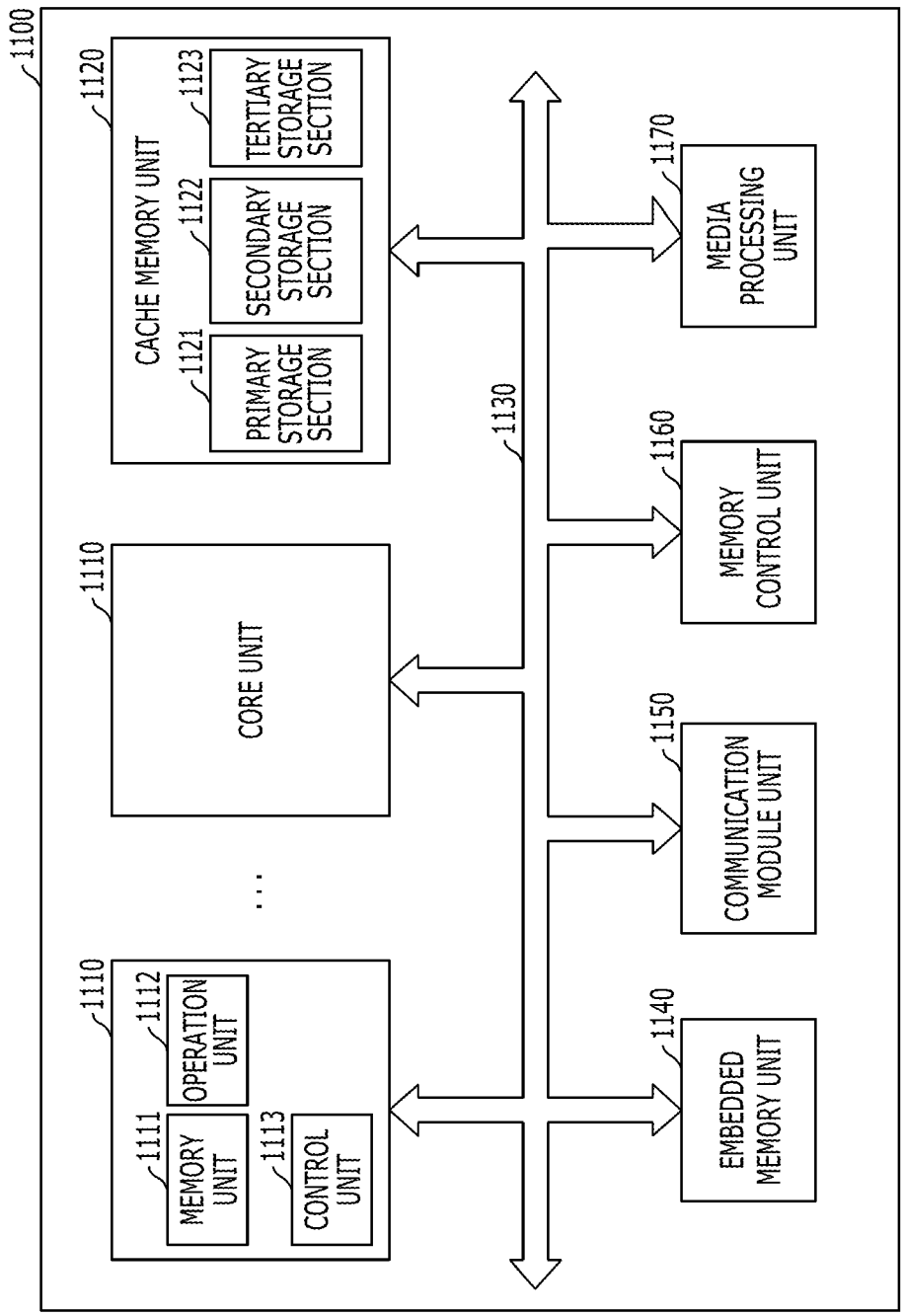
FIG. 11 is an example of configuration diagram of a processor implementing memory circuitry based on the disclosed technology.

FIG. 11 is an example of configuration diagram of a processor implementing memory circuitry based on the disclosed technology.

Referring to FIG. 11, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first electrode; a second electrode crossing the first electrode; and a variable resistance layer positioned at an intersection of the first electrode and the second electrode, and buried in the first electrode. An additional etch process for patterning the variable resistance layers is not required. Accordingly, a damage of the variable resistance layers due to the etch process may be prevented, and thus a change in characteristics of the variable resistance layers may be prevented. Through this, characteristics of a transistor of the cache memory unit 1120 may be improved, and the degree of process difficulty in fabricating the cache memory unit 1120 may be reduced by substantially preventing the occurrence of a step difference between regions difference from each other, thereby improving the data storage characteristics of the cache memory unit 1120 in case that the transistor is coupled to a memory element, for example, a resistance variable element. As a consequence, a fabrication process of the processor 1100 may become easy and performance characteristics of the processor 1100 may be improved.

Although it was shown in FIG. 11 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 12:
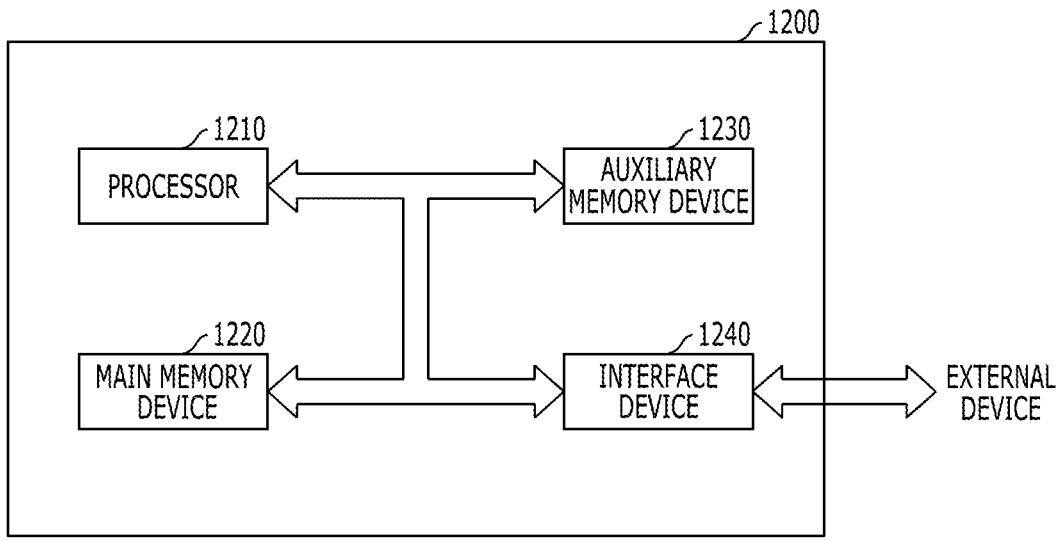
FIG. 12 is an example of configuration diagram of a system implementing memory circuitry based on the disclosed technology.

FIG. 12 is an example of configuration diagram of a system implementing memory circuitry based on the disclosed technology.

Referring to FIG. 12, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first electrode; a second electrode crossing the first electrode; and a variable resistance layer positioned at an intersection of the first electrode and the second electrode, and buried in the first electrode. An additional etch process for patterning the variable resistance layers is not required. Accordingly, a damage of the variable resistance layers due to the etch process may be prevented, and thus a change in characteristics of the variable resistance layers may be prevented. Through this, characteristics of a transistor of the main memory device 1220 may be improved, and the degree of process difficulty in fabricating the main memory device 1220 may be reduced by substantially preventing the occurrence of a step difference between regions difference from each other, thereby improving the data storage characteristics of the main memory device 1220 in case that the transistor is coupled to a memory element, for example, a resistance variable element. As a consequence, a fabrication process of the system 1200 may become easy and performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first electrode; a second electrode crossing the first electrode; and a variable resistance layer positioned at an intersection of the first electrode and the second electrode, and buried in the first electrode. An additional etch process for patterning the variable resistance layers is not required. Accordingly, a damage of the variable resistance layers due to the etch process may be prevented, and thus a change in characteristics of the variable resistance layers may be prevented. Through this, characteristics of a transistor of the auxiliary memory device 1230 may be improved, and the degree of process difficulty in fabricating the auxiliary memory device 1230 may be reduced by substantially preventing the occurrence of a step difference between regions difference from each other, thereby improving the data storage characteristics of the auxiliary memory device 1230 in case that the transistor is coupled to a memory element, for example, a resistance variable element. As a consequence, a fabrication process of the system 1200 may become easy and performance characteristics of the system 1200 may be improved.

Also, the auxiliary memory device 1230 may further include a data storage system (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 13:
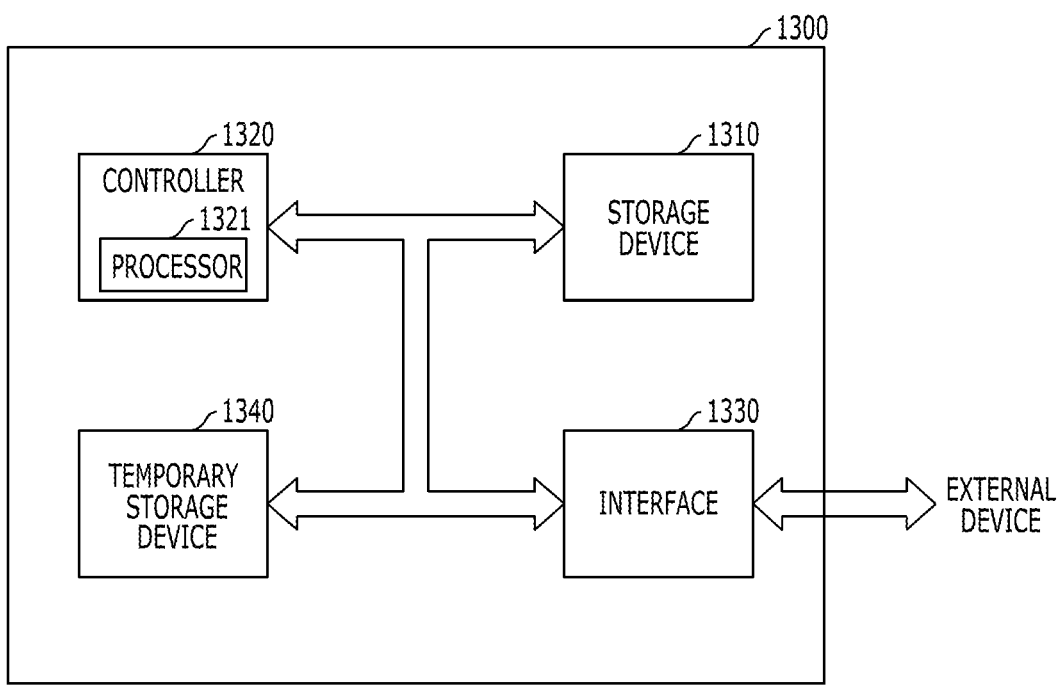
FIG. 13 is an example of configuration diagram of a data storage system implementing memory circuitry based on the disclosed technology.

FIG. 13 is an example of configuration diagram of a data storage system implementing memory circuitry based on the disclosed technology.

Referring to FIG. 13, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first electrode; a second electrode crossing the first electrode; and a variable resistance layer positioned at an intersection of the first electrode and the second electrode, and buried in the first electrode. An additional etch process for patterning the variable resistance layers is not required. Accordingly, a damage of the variable resistance layers due to the etch process may be prevented, and thus a change in characteristics of the variable resistance layers may be prevented. Through this, characteristics of a transistor of the temporary storage device 1340 may be improved, and the degree of process difficulty in fabricating the temporary storage device 1340 may be reduced by substantially preventing the occurrence of a step difference between regions difference from each other, thereby improving the data storage characteristics of the temporary storage device 1340 in case that the transistor is coupled to a memory element, for example, a resistance variable element. As a consequence, a fabrication process of the data storage system 1300 may become easy and performance characteristics of the data storage system 1300 may be improved.

Figure 14:
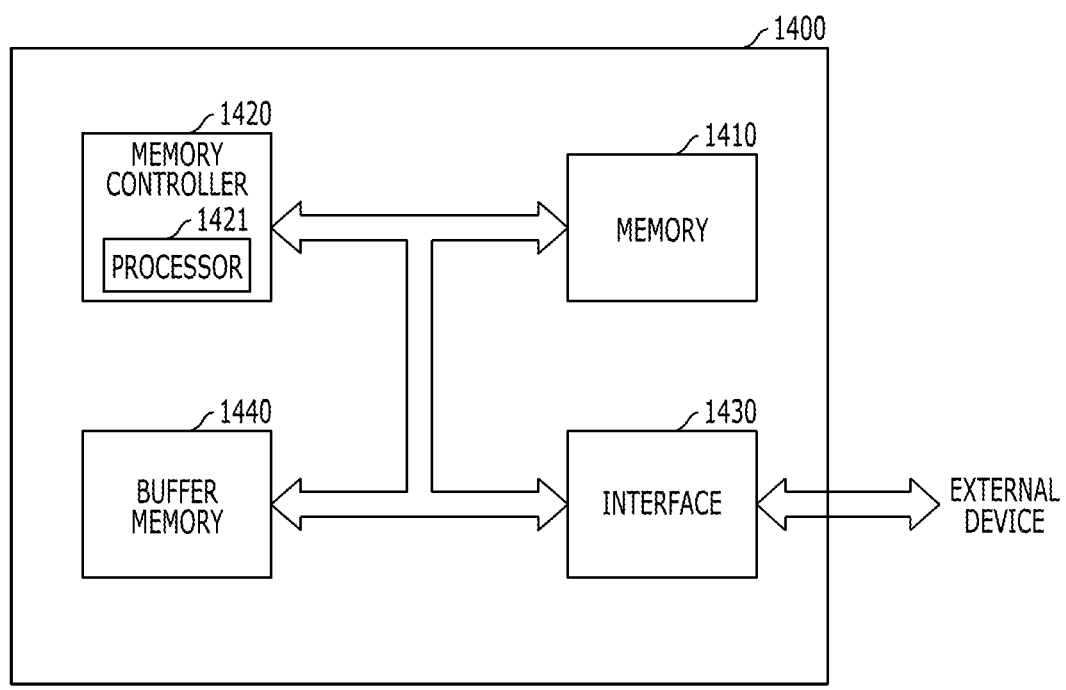
FIG. 14 is an example of configuration diagram of a memory system implementing memory circuitry based on the disclosed technology.

FIG. 14 is an example of configuration diagram of a memory system implementing memory circuitry based on the disclosed technology.

Referring to FIG. 14, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first electrode; a second electrode crossing the first electrode; and a variable resistance layer positioned at an intersection of the first electrode and the second electrode, and buried in the first electrode. An additional etch process for patterning the variable resistance layers is not required. Accordingly, a damage of the variable resistance layers due to the etch process may be prevented, and thus a change in characteristics of the variable resistance layers may be prevented. Through this, characteristics of a transistor of the memory 1410 may be improved, and the degree of process difficulty in fabricating the memory 1410 may be reduced by substantially preventing the occurrence of a step difference between regions difference from each other, thereby improving the data storage characteristics of the memory 1410 in case that the transistor is coupled to a memory element, for example, a resistance variable element. As a consequence, a fabrication process of the memory system 1400 may become easy and performance characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first electrode; a second electrode crossing the first electrode; and a variable resistance layer positioned at an intersection of the first electrode and the second electrode, and buried in the first electrode. An additional etch process for patterning the variable resistance layers is not required. Accordingly, a damage of the variable resistance layers due to the etch process may be prevented, and thus a change in characteristics of the variable resistance layers may be prevented. Through this, characteristics of a transistor of the buffer memory 1440 may be improved, and the degree of process difficulty in fabricating the buffer memory 1440 may be reduced by substantially preventing the occurrence of a step difference between regions difference from each other, thereby improving the data storage characteristics of the buffer memory 1440 in case that the transistor is coupled to a memory element, for example, a resistance variable element. As a consequence, a fabrication process of the memory system 1400 may become easy and the performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the electronic device and the method for fabricating the same in accordance with the implementations, by forming the variable resistance layer which is positioned at an intersection of the electrodes, buried in the electrodes, an additional etch process for patterning the variable resistance layers is not required. Accordingly, a damage of the variable resistance layers due to the etch process may be prevented, and thus a change in characteristics of the variable resistance layers may be prevented.

Features in the above examples of electronic devices or systems in FIGS. 10-14 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, the semiconductor memory comprising:
    a first electrode;
    a second electrode crossing the first electrode; and
    a variable resistance pattern disposed in an intersection region of the first electrode and the second electrode, and entirely buried in the first electrode.

2. The electronic device of claim 1, further comprising:
    a barrier layer disposed between the first electrode and the variable resistance pattern.

3. The electronic device of claim 2, wherein the barrier layer includes a selection element material.

4. The electronic device according to claim 3, wherein the selection element material includes one or more layers of titanium nitride (TiN) and niobium oxide (NbO2).

5. The electronic device of claim 1, wherein a line width of the second electrode in a direction is identical to or smaller than a width of the variable resistance pattern in the same direction.

6. The electronic device of claim 1, wherein the variable resistance pattern includes one or more layers of a transitional metal oxide, a perovskite-based oxide, and a chalcogenide-based compound.

7. The electronic device according to claim 1, further comprising a microprocessor which includes:
    a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

8. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

9. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

10. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

11. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

* * * * *